US012640326B2

(12) United States Patent
Jeong et al.

(10) Patent No.: US 12,640,326 B2
(45) **Date of Patent: \*May 26, 2026**

(54) SYSTEMS AND METHODS FOR FABRICATING SILICON DIE STACKS FOR ELECTRON EMITTER ARRAY CHIPS

(71) Applicant: NANO-X IMAGING LTD, Neve-Ilan (IL)

(72) Inventors: Ukyo Jeong, Morgan Hill, CA (US); Ghiyuun Kang, Seoul (KR)

( * ) Notice: Subject to any disclaimer, the term of this patent is extended or adjusted under 35 U.S.C. 154(b) by 18 days.

This patent is subject to a terminal disclaimer.

(21) Appl. No.: 18/760,072

(22) Filed: Jul. 1, 2024

(65) Prior Publication Data

US 2024/0371819 A1     Nov. 7, 2024

Related U.S. Application Data

(63) Continuation of application No. 18/282,005, filed as application No. PCT/IB2022/052288 on Mar. 14, 2022, now Pat. No. 12,027,489.

(60) Provisional application No. 63/160,992, filed on Mar. 15, 2021.

(51) Int. Cl.
| | |
|---|---|
| *H01L 23/00* | (2006.01) |
| *H01J 9/02* | (2006.01) |
| *H01J 35/06* | (2006.01) |

(52) U.S. Cl.
CPC .............. *H01L 24/83* (2013.01); *H01J 9/025* (2013.01); *H01J 35/065* (2013.01); *H01L 24/05* (2013.01); *H01L 24/27* (2013.01); *H01L 24/29* (2013.01); *H01L 24/32* (2013.01); *H01L 24/45* (2013.01); *H01L 24/48* (2013.01); *H01L 24/73* (2013.01); *H01L 24/92* (2013.01); *H01L 24/06* (2013.01); *H01L 2224/05073*
(2013.01); *H01L 2224/05155* (2013.01); *H01L 2224/05573* (2013.01); *H01L 2224/05644* (2013.01); *H01L 2224/0603* (2013.01); *H01L 2224/06181* (2013.01); *H01L 2224/27442* (2013.01); *H01L 2224/29139* (2013.01); *H01L 2224/32227* (2013.01); *H01L 2224/45144* (2013.01); *H01L 2224/48091* (2013.01); *H01L 2224/48227* (2013.01); *H01L 2224/48464* (2013.01); *H01L 2224/73265* (2013.01); *H01L 2224/83191* (2013.01); *H01L 2224/83192* (2013.01); *H01L 2224/83201* (2013.01); *H01L 2224/83444* (2013.01); *H01L 2224/8384* (2013.01); *H01L 2224/92247* (2013.01)

(58) Field of Classification Search
CPC ........... H01J 2201/319; H01J 2235/062; H01J 1/3044; H01L 23/13; H01L 23/15; H01L 23/49827; H01L 23/49833; H01L 23/29199; H01L 23/29339; H01L 23/84399; H01L 2924/10253
USPC .......................................................... 438/20
See application file for complete search history.

(56) References Cited

U.S. PATENT DOCUMENTS 12,027,489 B2 *   7/2024   Jeong ..................... H01L 24/27

\* cited by examiner

*Primary Examiner* — Jasmine J Clark
(74) *Attorney, Agent, or Firm* — Daniel J. Swirsky; AlphaPatent Associates Ltd.

(57)     ABSTRACT

A chip mounted field emitter array method for their fabrication by applying sintering to bind a substrate die to other die layers. Metal powder is applied to the bonding surface of the die, covered with the chip carrier or chip and compressed between two heated plates. The bonding pads of the die may be conductively coupled to corresponding bonding pads of the other die layers.

20 Claims, 7 Drawing Sheets

100

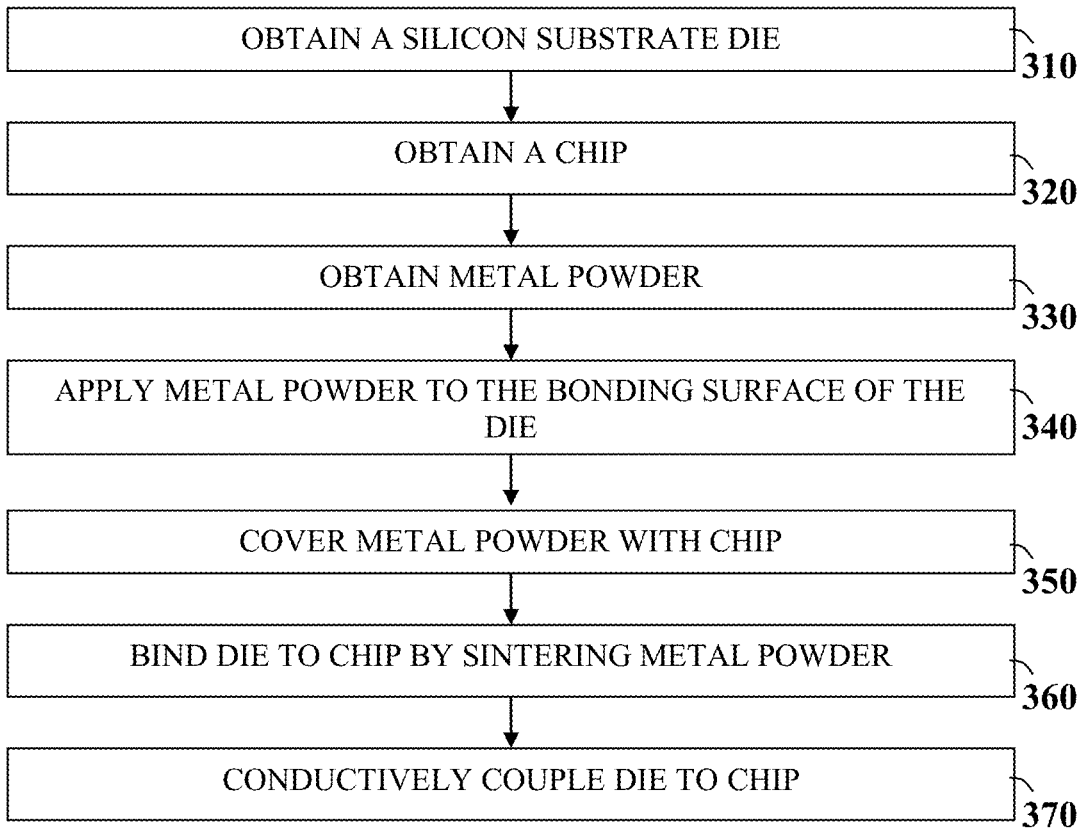

OBTAIN A SILICON SUBSTRATE DIE    310

OBTAIN A CHIP    320

OBTAIN METAL POWDER    330

APPLY METAL POWDER TO THE BONDING SURFACE OF THE DIE    340

COVER METAL POWDER WITH CHIP    350

BIND DIE TO CHIP BY SINTERING METAL POWDER    360

CONDUCTIVELY COUPLE DIE TO CHIP    370

Fig. 3A

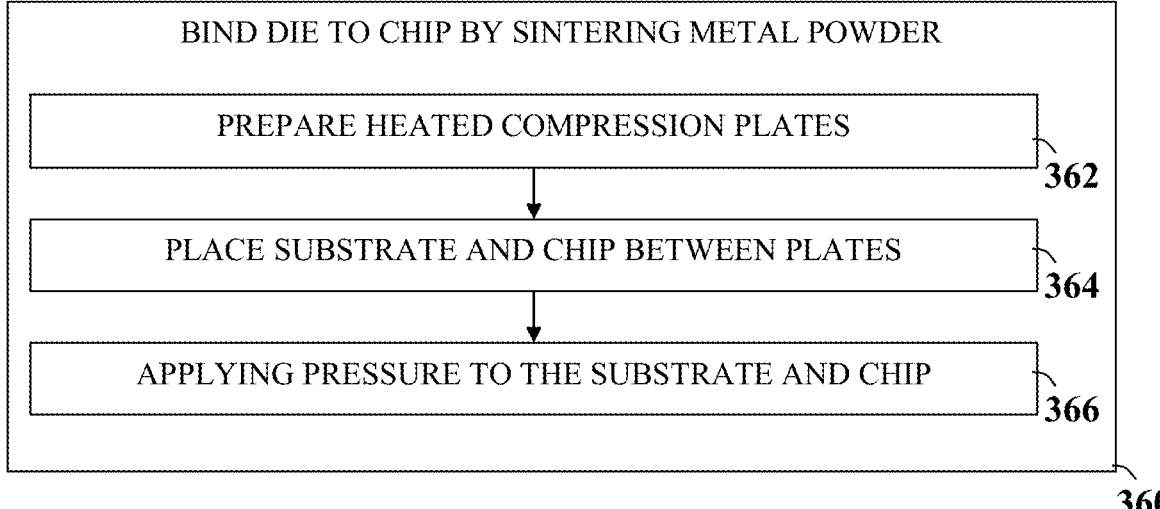

BIND DIE TO CHIP BY SINTERING METAL POWDER

PREPARE HEATED COMPRESSION PLATES    362

PLACE SUBSTRATE AND CHIP BETWEEN PLATES    364

APPLYING PRESSURE TO THE SUBSTRATE AND CHIP    366

SYSTEMS AND METHODS FOR FABRICATING SILICON DIE STACKS FOR ELECTRON EMITTER ARRAY CHIPS

CROSS-REFERENCE TO RELATED APPLICATIONS

This application is a continuation of U.S. patent application Ser. No. 18/282,005, filed Sep. 14, 2023, now U.S. Pat. No. 12,027,489, which is a U.S. National Phase Application under 35 U.S.C. 371 of International Application No. PCT/IB2022/052288, which has an international filing date of Mar. 14, 2022, and which claims the benefit of priority from U.S. Provisional Patent Application No. 63/160,992, filed Mar. 15, 2021, the contents of which are incorporated by reference in their entirety.

FIELD OF THE INVENTION

The disclosure herein relates to systems and methods for fabricating silicon die stacks for electron emitter chips. In particular the disclosure relates to methods for binding a silicon substrate die to a chip such that it is suitable for use within a vacuum tube.

BACKGROUND

Silicon chips are generally mounted to substrate dies by soldering the silicon of the chip to the ceramic base of the substrate. Chip carriers are commonly used to package integrated circuits or chips. The chip carrier typically has electrical connections around a perimeter surrounding a cavity for containing the integrated circuit chip. Various examples of chip carriers include ceramic leadless chip carriers (CLCC), Bump chip carriers, plastic leaded chip carriers (PLCC), Leaded chip carriers (LCC) and the like as well as package on package (POP) carriers.

Chips are typically attached to substrates, chip carriers or packages using soldering techniques which require significant cleaning. Even the so called no-clean pastes which are commonly used fail to obviate the need for cleaning and leave a small amount of residue on the chips. In addition other problems associated with solder pastes include entrapped bubbles between the surfaces as well as steaming during the curing process which may lead to steam pathways through the solder which may separate from the board allowing environmental penetration of the overall assembly.

Furthermore, tin based pastes and the like which are commonly used in solder have been shown to be unsuitable for use within vacuum tubes which may require subsequent high temperature processes for seasoning and vacuum pumping. Such pastes will typically liquefy at temperatures of 400-500 degrees Celsius which are often reached during the vacuuming of the tube. Accordingly, the solder tends to outgas into the environment thereby compromising the desired vacuum, and the liquefaction of the solder may allow the chip to move from the initial position The need remains, therefore, for better and more efficient techniques for the attachment of the layers of a chip die. The invention described herein addresses the above-described needs.

SUMMARY OF THE INVENTION

It is an aspect of the invention to teach a method for fabricating a field emitter array. The method includes obtaining a silicon substrate die having a bonding surface; obtaining a chip carrier having an electric circuit and wire bonding surfaces; and obtaining a metal powder.

According to the method a metal powder may be applied to the bonding surface of the die, covered with the chip carrier and compressed between two heated plates. The bonding pads of the die may be conductively coupled to corresponding bonding pads of the chip carrier.

Where appropriate, a bonded chip and chip carrier arrangement may be prepared by obtaining an integrated circuit chip having a gold coated silicon base; obtaining a chip carrier having a gold coated upper side; applying a first layer of metal powder to the gold coated upper side of the chip carrier; covering the first layer of metal powder with the integrated circuit chip; and compressing the integrated circuit chip and carrier between the two heated plates.

Accordingly this bonded chip and chip carrier may be bound and conductively connected to the silicon substrate die through applying a second layer of metal powder to the bonding surface of the die; covering the second layer metal powder with the chip carrier; compressing the die and the bonded chip and chip carrier between two heated plates; and conductively coupling bonding pads of the die to corresponding bonding pads of the chip carrier.

Optionally, the chip carrier comprises a Ceramic Leadless Chip Carrier (CLCC).

According to various embodiments, the metal powder may comprise particles having a size of 100 nanometers. Where appropriate, the metal powder comprises particles of silver.

In order to bind the elements through sintering, the heated plates may be configured to heat the metal powder to a temperature lower than its melting point but above its bonding temperature. For example the heated plates may be brought to a temperature of 830 degrees Celsius and a pressure of 10-8 Torr may be applied for 10 minutes or so.

Optionally, the step of conductively coupling bonding pads of the die to corresponding bonding pads of the chip carrier comprises using wire bonding.

The metal powder maybe applied by dispensing the metal powder at a required thickness or a required volume of the metal powder as required for example by dispensing the metal powder from a syringe

BRIEF DESCRIPTION OF THE DRAWINGS

For a better understanding of the embodiments and to show how it may be carried into effect, reference will now be made, purely by way of example, to the accompanying drawings.

With specific reference now to the drawings in detail, it is stressed that the particulars shown are by way of example and for purposes of illustrative discussion of selected embodiments only, and are presented in the cause of providing what is believed to be the most useful and readily understood description of the principles and conceptual aspects. In this regard, no attempt is made to show structural details in more detail than is necessary for a fundamental understanding; the description taken with the drawings making apparent to those skilled in the art how the various selected embodiments may be put into practice. In the accompanying drawings:

FIG. 3A is a flowchart illustrating selected steps of a method for fabricating a field emitter array;

FIG. 3B is a flowchart illustrating selected steps of a method for binding die to chip by sintering metal powder;

DETAILED DESCRIPTION

Figure 1A:
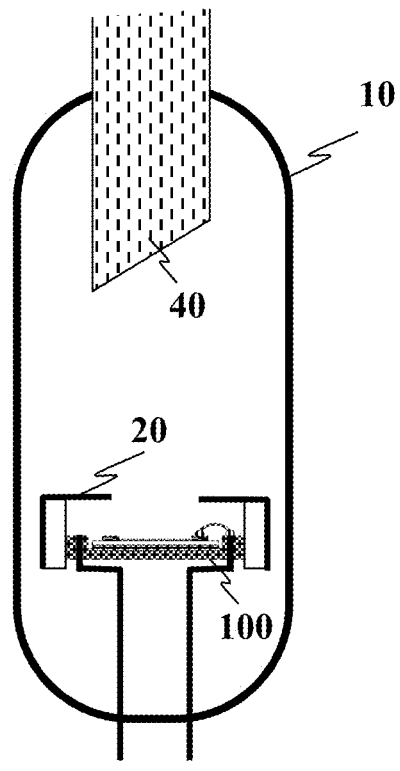
FIG. 1A schematically represents a cross section through an example of an x-ray vacuum tube including a metal bonded electron emitter array chip of the disclosure.

Aspects of the present disclosure relate to systems and methods for fabricating silicon die stacks for electron emitter chips. In particular the disclosure relates to methods for applying sintering to bind a silicon substrate die to other die layers such as a chip or a chip carrier.

A Field emitter array (FEA) for use in an x-ray vacuum tube may be fabricated on the top surface of a silicon substrate. Optionally, the FEA die may then be attached to a chip carrier that is equipped with an electrical circuit and wire bonding surfaces using methods described below.

A binding layer may be prepared by applying very fine powder or flakes of metal such as silver between the bonding surfaces of the die substrate and the chip. Typically, the average size of the metal particles in the form of powder or flake is less than 100 nm.

The die and the chip may be placed between two heated plates and the two plates may be compressed to effect the adhesion between the bonding surfaces and the metal particles.

The assembly may be electrically connected by wire bonding between the bonding pads, for example bonding pads of the die and the pads on the chip or chip carrier.

Precision and repeatability may be very important, particularly for the positioning of the focal spot on an anode target of an x-ray emitter. Accordingly, a die and a chip carrier may be held in place during the process so that the location of the die remains in the prescribed place with desired precision. This leads to the location of the focal spot of the x-ray tubes to be consistent and repeatable.

It is noted that sintering allows attachment of the layers at lower temperatures. The fine powder of the metal bonding agent makes strong bonds at a lower temperature even than the melting point of the metal. For example, silver power makes a bond at 300 degrees Celsius although the melting point of silver is 961.8 degrees Celsius. The strength of the bond has been found to grow even stronger in the subsequent heat cycles below the melting temperature.

The system and method described herein may be readily automated. By way of example, the metal powder can be dispensed with a syringe or other robotic means that dispense the power at the prescribed amount and thickness.

It is further noted that metal bonding of the die makes a highly thermally conductive bond as well as an electrically conductive bond. This is an important factor in the dissipation of heat generated by the field emission array which may extend the lifetime of the x-ray emitting device by preventing the degradation by excessive heat.

As required, detailed embodiments of the present invention are disclosed herein; however, it is to be understood that the disclosed embodiments are merely examples of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

As appropriate, in various embodiments of the disclosure, one or more tasks as described herein may be performed by a data processor, such as a computing platform or distributed computing system for executing a plurality of instructions. Optionally, the data processor includes or accesses a volatile memory for storing instructions, data or the like. Additionally or alternatively, the data processor may access a non-volatile storage, for example, a magnetic hard disk, flash-drive, removable media or the like, for storing instructions and/or data.

It is particularly noted that the systems and methods of the disclosure herein may not be limited in its application to the details of construction and the arrangement of the components or methods set forth in the description or illustrated in the drawings and examples. The systems and methods of the disclosure may be capable of other embodiments, or of being practiced and carried out in various ways and technologies.

Alternative methods and materials similar or equivalent to those described herein may be used in the practice or testing of embodiments of the disclosure. Nevertheless, particular methods and materials described herein for illustrative purposes only. The materials, methods, and examples not intended to be necessarily limiting. Accordingly, various embodiments may omit, substitute, or add various procedures or components as appropriate. For instance, the methods may be performed in an order different from described, and that various steps may be added, omitted or combined. In addition, aspects and components described with respect to certain embodiments may be combined in various other embodiments.

Reference is now made to FIG. 1A which schematically represents a cross section through an example of an x-ray vacuum tube 10. The x-ray vacuum tube 10 includes a cold cathode electron source 100, a gate electrode 20 and a target anode 40 all held within a sealed glass chamber from which air has been evacuated.

A beam of electrons may be produced by the cold cathode electron source 100 and directed towards a focal point on the anode target 40 such that x-rays may be produced.

Figure 1B:
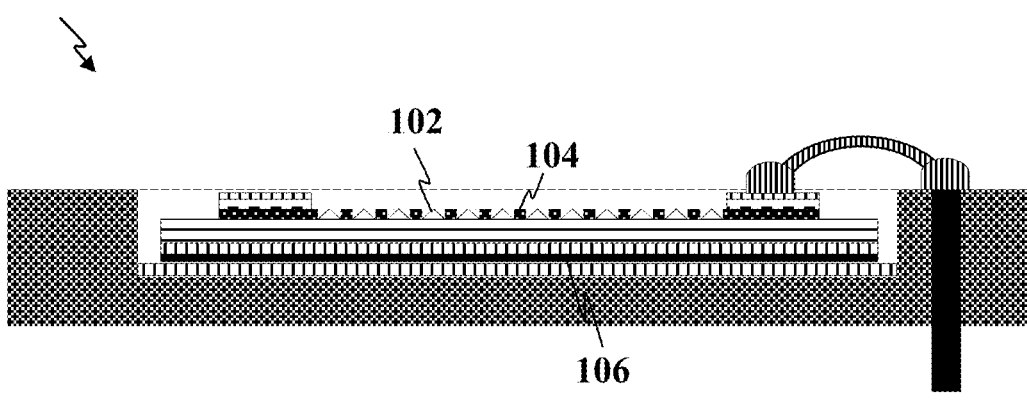
FIG. 1B schematically represents the metal bonded electron emitter array chip of the disclosure.

The cold cathode electron source 100 may be a field array emission chip such as a gated cone electron source having cones 102 ("emitter tips") arranged in an array, each emitter tip being surrounded by an opening in the gate electrode 104 (a "gate hole"), a Spindt type electron source, a carbon nanotube (CNT) type electron source, a metal-insulator-metal (MIM) type electron source or a metal-insulator-semiconductor (MIS) type electron source. In particular embodiments, the electron source may be a Spindt type electron source. FIG. 1B schematically represents such an electron emitter array chip, the emitter chip may be bound to the substrate using metal bonding 106.

Figures 2A, 2B, 2C, 2D:
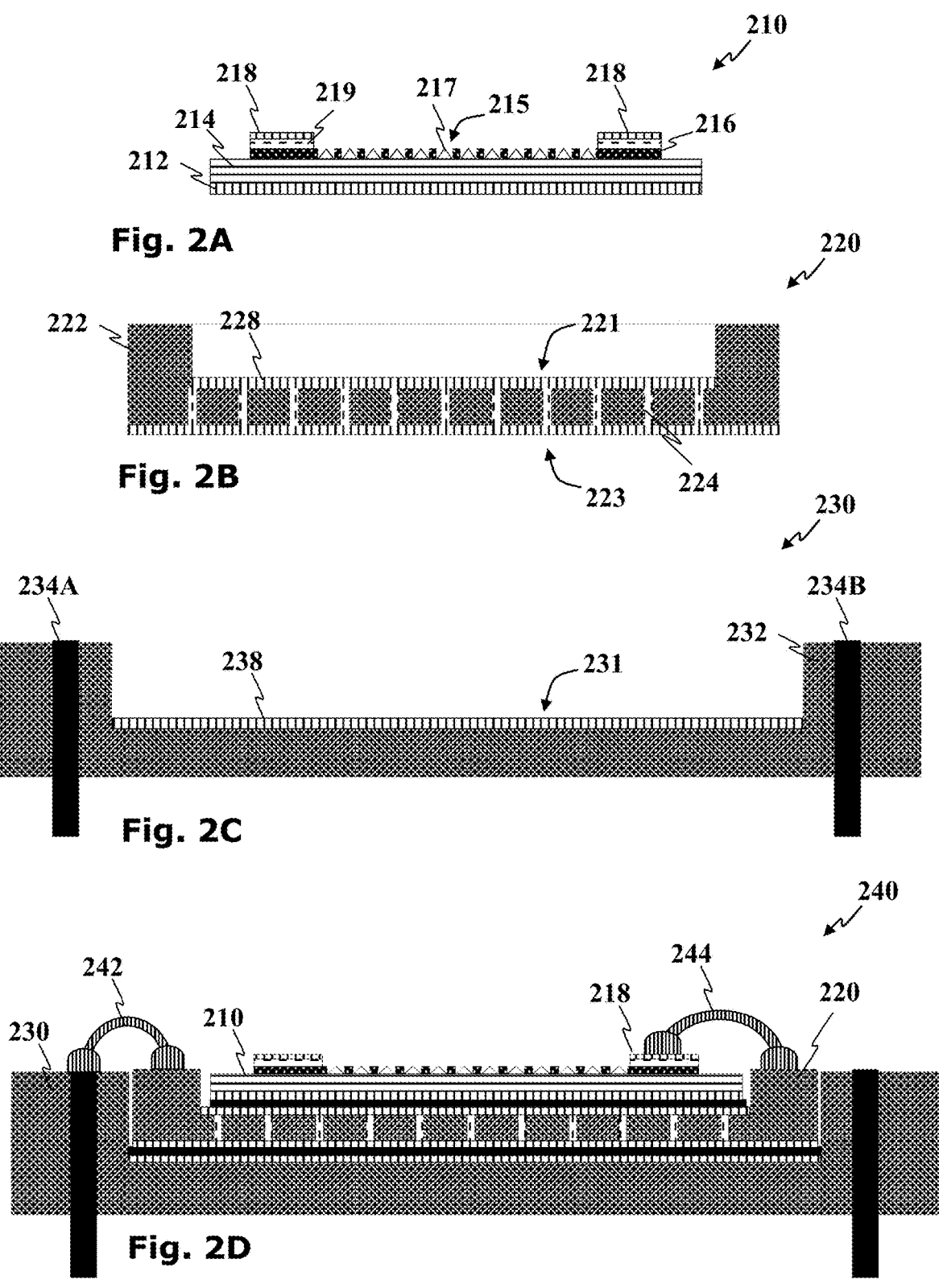
FIG. 2A schematically represents a cross section through an example of an integrated circuit chip such as an emitter array chip.
FIG. 2B schematically represents a cross section through an example of a chip carrier for packaging a chip such as an emitter array chip.
FIG. 2C schematically represents a silicon substrate die for a chip carrier of the embodiment.
FIG. 2D schematically represents a bonded and electrically connected arrangement of the chip, chip carrier and substrate die according to an embodiment of the disclosure.

With reference to FIG. 2A, which schematically represents a cross section through an example of an integrated circuit chip 210 such as an emitter array chip, the chip assembly may include a silicon base 214 upon which an array of emission cone electrodes 217 is mounted as well as a chromium gate layer 216 having holes 215 therethrough so as to accommodate the emission cone electrodes 217. Adhesion of the gold electrical connecting pads 218 to the chromium of the gate layer may be facilitated by an intermediate layer of nickel 219. A gold coating 212 may be applied to the underside of the silicon base 214.

As shown in FIG. 2C, the substrate die 230 may include a ceramic layer 232 having feed through electrical connectors 234A, 234B.

It is a particular feature of the current disclosure that the chip 210 is attached to the substrate 230 using sintered silver powder to form a bonding layer. It is further noted that silver may not adhere well to ceramic 222, 232 and silicon base 214. Accordingly, the substrate may be coated along its upper surface 231 with a thin gold layer 238. Similarly the underside of the silicon base 214 of the chip 210 may be coated with a thin gold layer 212. The gold layers may assist adhesion of the layers as well as thermal and electrical coupling of the chip and substrate.

Reference is now made to FIG. 2B which schematically represents a cross section through an example of a chip carrier 220 for packaging a chip such as an emitter array chip 210. The chip carrier 220 includes a ceramic base 222 configured to carry the chip 210 therewithin. Conductive vias 224, typically of tungsten or the like, provide conductive pathways from the upper surface 221 of the carrier which is typically bound to a chip 210 and the lower surface 223 which is typically bound to the substrate 230. The upper surface 221 and lower surface 223 of the carrier chip 220 may be coated with a thin layers of gold 226, 228 to facilitate adhesion of the silver to the ceramic base 222 of the chip carrier 220 and the silicon base 214 of the chip 210.

Referring now to FIG. 2D, which schematically represents a cross section through another embodiment of a bonded and electrically connected arrangement 240 of the chip 210, chip carrier 220 and substrate die 230. It will be appreciated that this arrangement may be useful in automated systems where the chip 210 may be bonded to the carrier 220 before the carrier 220 is bonded to the substrate 230 thereby improving repeatability. Conductive couplers 242, 244 may be used to electrically connect the various elements, for example using connecting pads 218.

Referring now to the flowchart of FIG. 3A is a flowchart selected steps are presented for fabrication method of a field emitter array for example for use in a vacuum tube. The method may include: obtaining a silicon substrate die having a bonding surface 310; obtaining a chip having an electric circuit and wire bonding surfaces 320; obtaining a metal powder such as silver powder 330; applying the metal powder to the bonding surface of the die 340; covering the metal powder with the chip 350; binding the die to the chip by sintering the metal powder 360 and conductively coupling the die to the chip, say with wire bonding 370.

The flowchart of FIG. 3B illustrates selected steps of a method for binding die to chip carrier by sintering metal powder. Heated compression plates may be prepared 362, the substrate and the chip may be placed between the heated compression plates 364 and pressure may be applied to the substrate and chip 366 such that the metal powder undergoes sintering binding the layers together.

In various examples the metal powder may consist of silver powder or silver paste including particles having a size of 100 nanometers or so. It is noted that the heated compression plates may be heated to a temperature lower than the melting point of the metal powder but above its bonding temperature. Thus for example, silver powder may be heated to a temperature above 300 degrees Celsius but below 900 degrees Celsius, say to 830 degrees Celsius or so.

The pressure applied may be selected as suits requirements, it has been found that applying a pressure of 10-8 Torr for 10 minutes may effect a good sinter bonding.

Once bonded, the electrical connectors and bonding pads of each of the layers may be conductively coupled by wire bonding typically using gold wire.

Figure 4A:
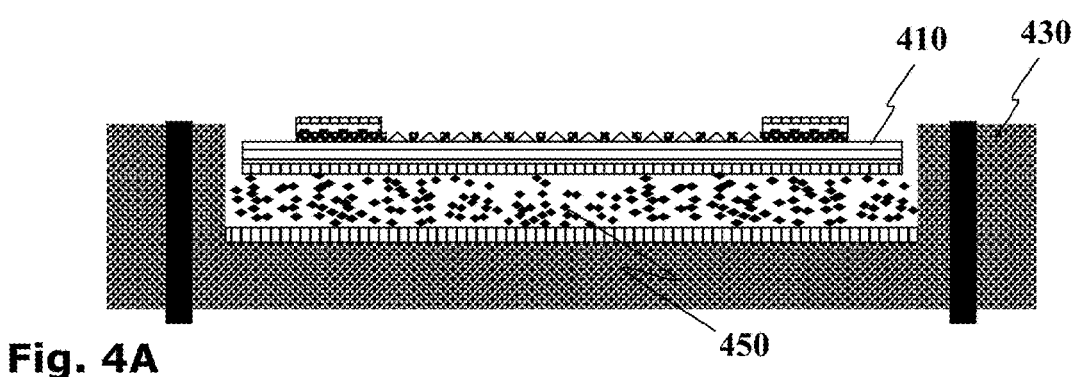
FIG. 4A schematically illustrates how a metal powder may be applied between the chip and the silicon die substrate.
Figure 4B:
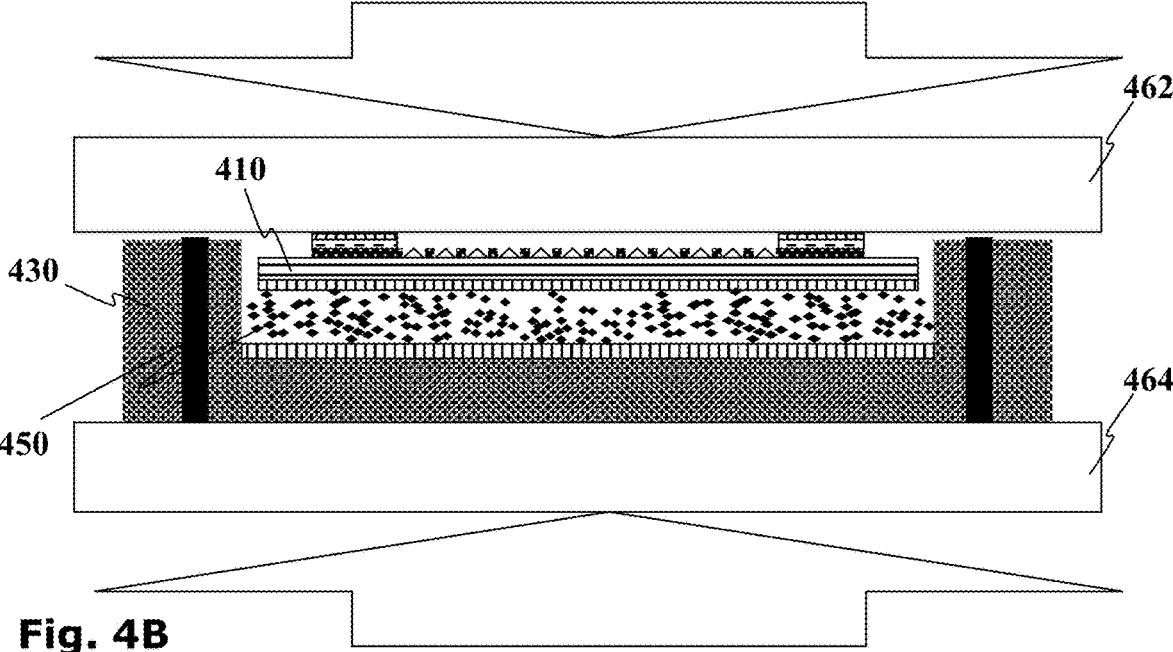
FIG. 4B schematically illustrates how the chip and the silicon die substrate may be compressed between heated plates so as to facilitate sintering reaction of the metal powder thereby binding the chip to the silicon die substrate.
Figure 4C:
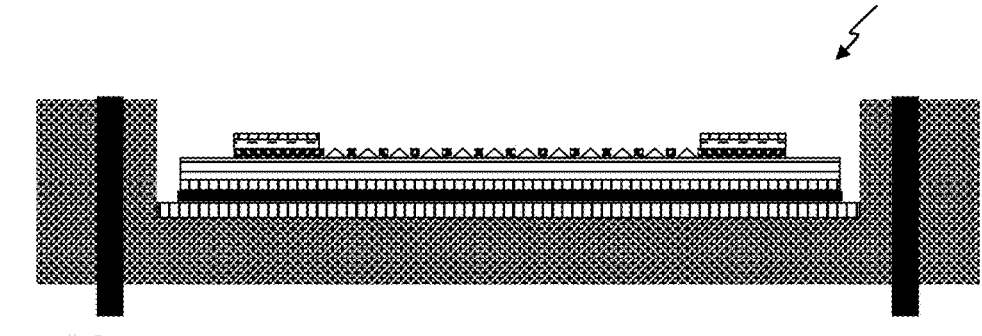
FIG. 4C schematically illustrates the bonded chip and silicon die substrate following sintering of the metal powder.

Referring now to FIGS. 4A-C, a bonded stack 440 may be formed by applying a metal powder 450 between the chip 410 and the silicon die substrate 430, and the chip 410 and the silicon die substrate 430 may be compressed between heated plates so as to facilitate sintering of the metal powder 450 thereby binding the chip 410 to the silicon die substrate 430.

The metal powder 450 may be applied for example using a syringe to ensure even distribution at the required thickness. It is particularly noted that an automated syringe may be able to provide an appropriate bolus of metal powder by dispensing a known volume suitable for the purpose.

Figures 5A, 5B, 5C:
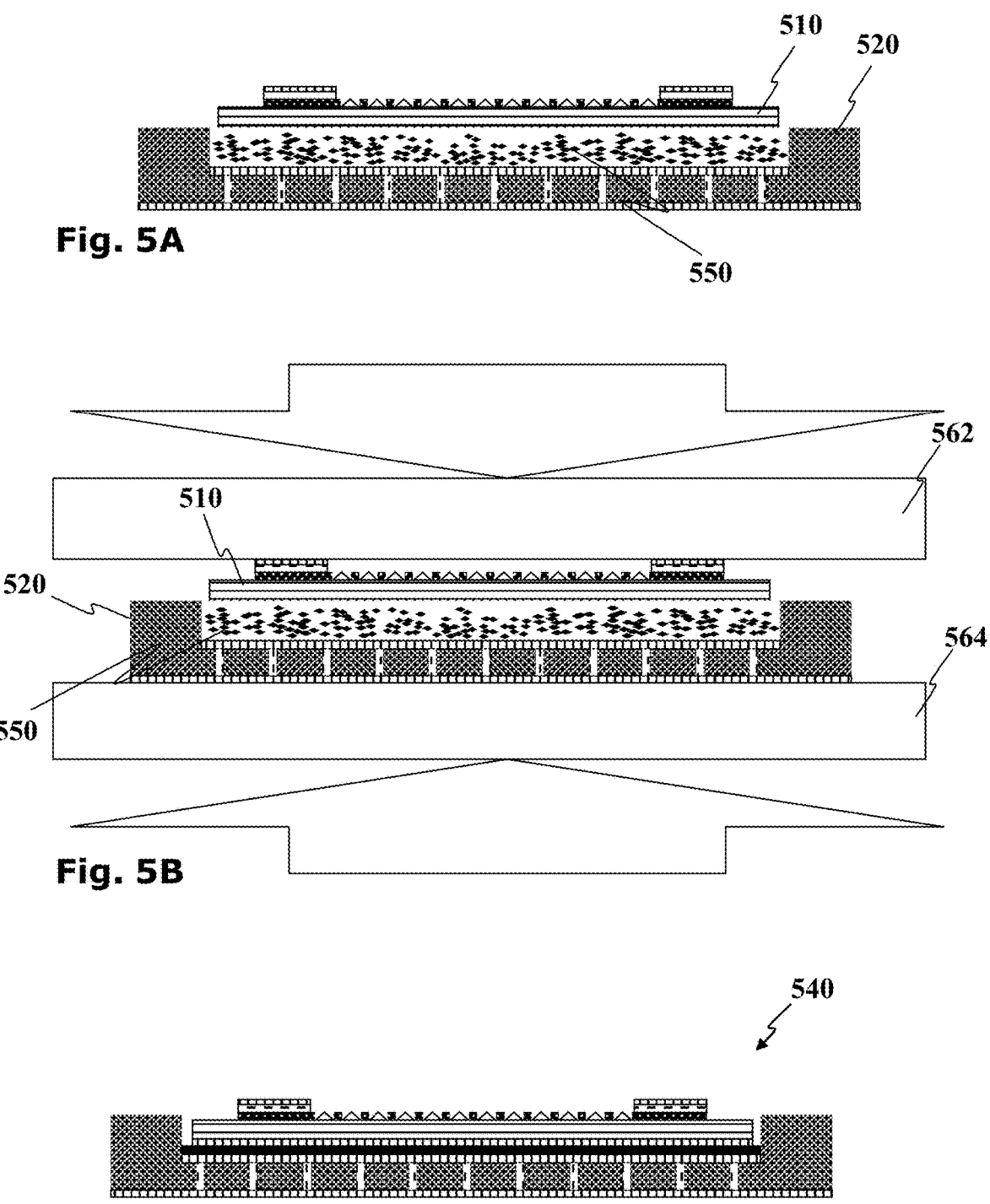
FIG. 5A schematically illustrates how a metal powder may be applied between the chip and the chip carrier.
FIG. 5B schematically illustrates how the chip carrier and the silicon die substrate may be compressed between heated plates so as to facilitate sintering of the metal powder thereby binding the chip to the chip carrier.
FIG. 5C schematically illustrates the bonded chip and chip carrier following sintering of the metal powder.

Referring now to FIGS. 5A-C, it is noted that alternatively, a bonded carrier 540 may be formed by applying the chip 510 may be bonded first to a chip carrier 520 by applying a metal powder 550 may be applied between the chip 510 and the chip carrier 520, such as a Ceramic Leadless Chip Carrier (CLCC), for example, and compressing the chip carrier 520 and the silicon die substrate between the heated plates 562, 564 so as to facilitate sintering of the metal powder 550 thereby binding the chip 510 to the chip carrier 520. The bonded chip and chip carrier 540 are bonded following sintering of the metal powder 550.

Figures 6A, 6B, 6C:
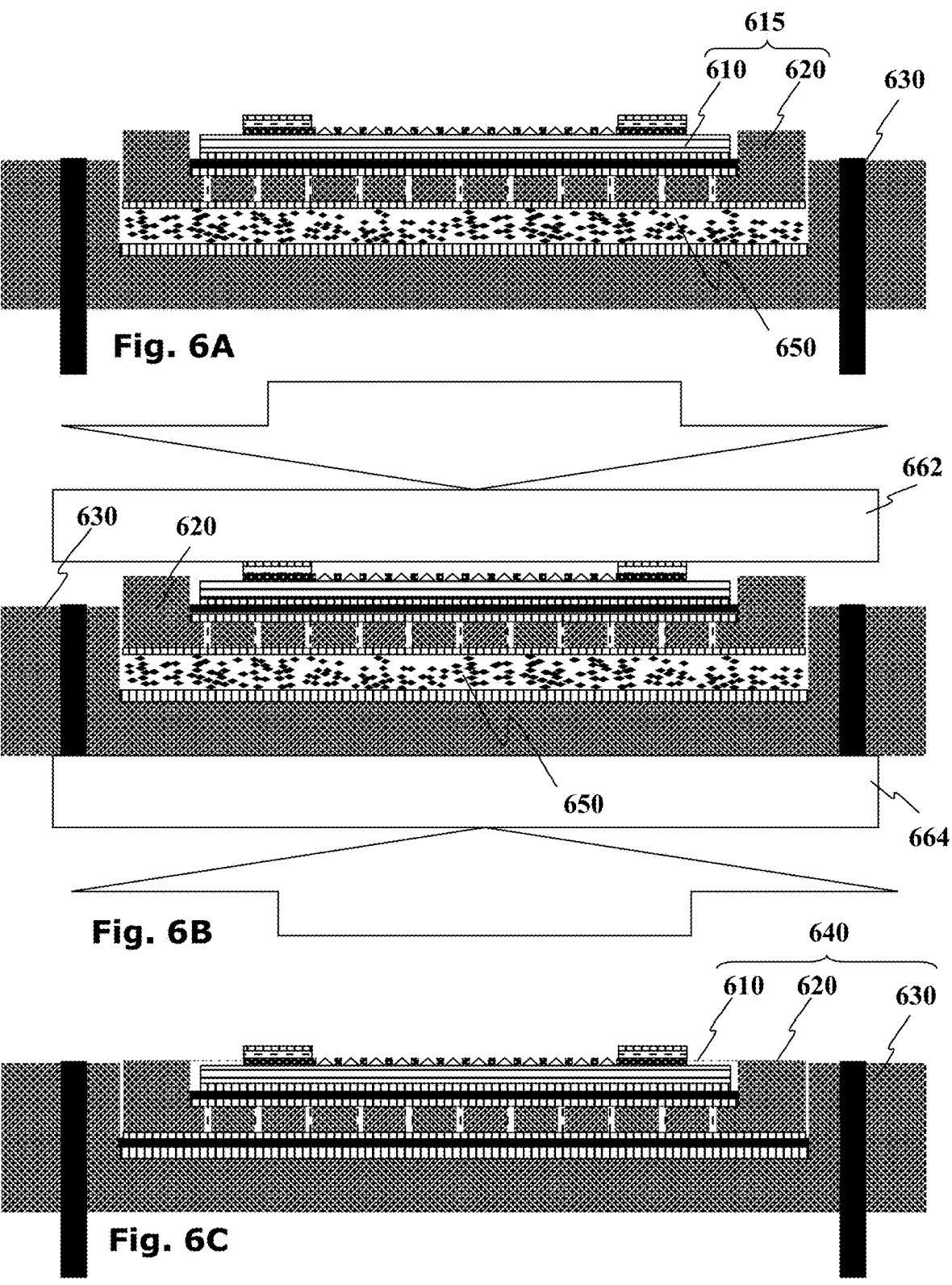
FIG. 6A schematically illustrates how a metal powder may be applied between the chip carrier and the silicon die substrate.
FIG. 6B schematically illustrates how the chip carrier and the silicon die substrate may be compressed between heated plates so as to facilitate sintering of the metal powder thereby binding the chip carrier to the silicon die.
FIG. 6C schematically illustrates the bonded chip carrier and the silicon die substrate following sintering of the metal powder.

FIGS. 6A-C illustrate how the bonded arrangement 615 of a chip 610 and chip carrier 620 may be bonded to the silicon die substrate 630 to form a stacked arrangement 640 by introducing a metal powder 650 between the chip carrier 620 and the silicon die substrate 630 which are then compressed between heated plates 662, 664 so as to facilitate sintering reaction of the metal powder 650 thereby binding the chip carrier 620 to the silicon die 630.

Figures 7A, 7B, 7C:
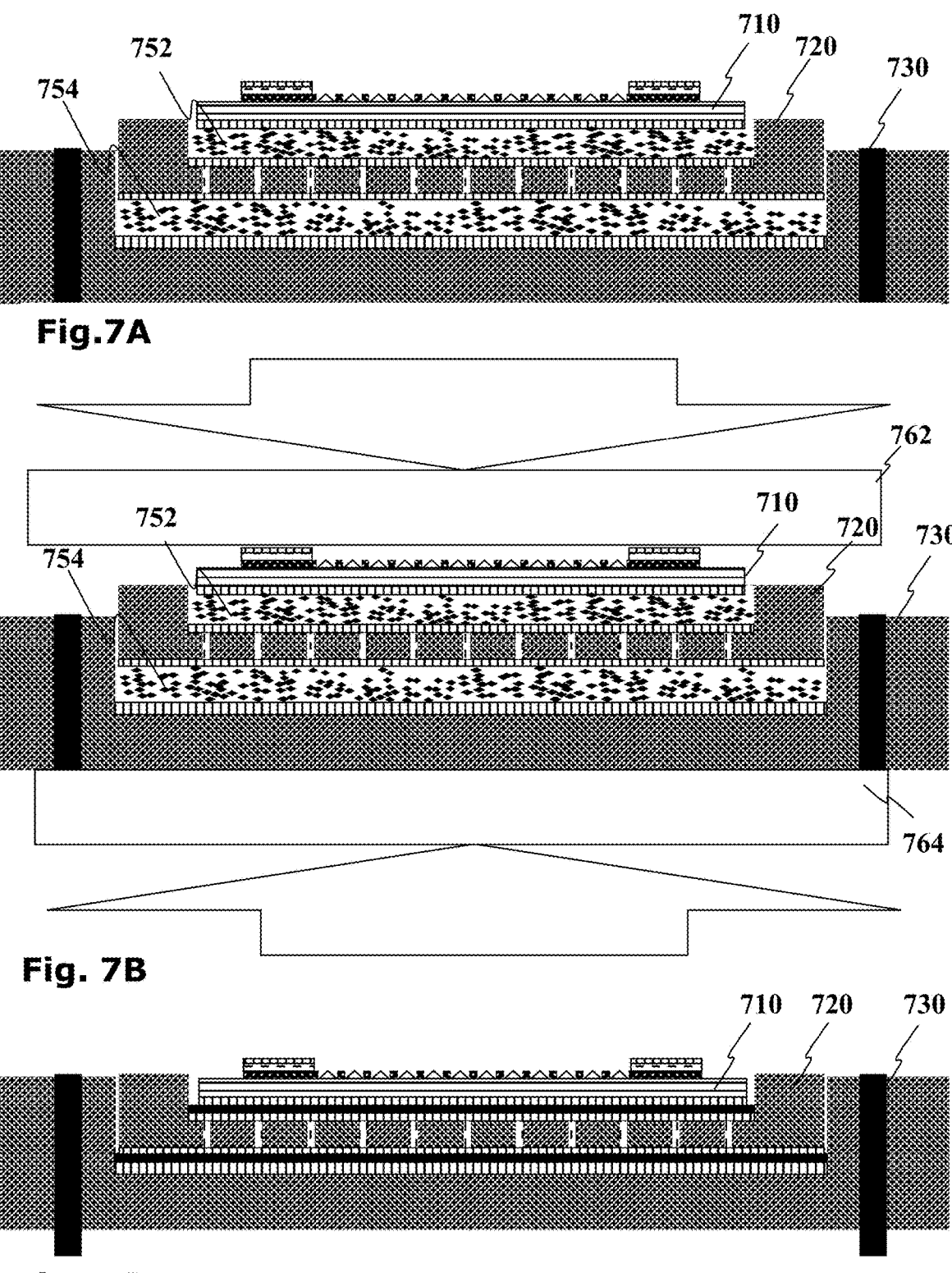
FIG. 7A schematically illustrates how a metal powder may be applied between both the chip and the chip carrier as well as the chip carrier and the silicon die substrate.
FIG. 7B schematically illustrates how the chip, the chip carrier and the silicon die substrate may all be compressed between heated plates so as to facilitate sintering of the metal powder thereby binding the chip to the chip carrier and the chip carrier to the silicon die.
FIG. 7C schematically illustrates the bonded chip, chip carrier and the silicon die substrate following sintering of the metal powder.

Still a further method is illustrated in FIGS. 7A-C in which the sinter bonding between both the chip 710 and the chip carrier 720 as well as the chip carrier 720 and the silicon die substrate 730 may be effected in one compression between heated plates 762, 764 thereby facilitate sintering reaction of the metal powder 752, 754.

Technical and scientific terms used herein should have the same meaning as commonly understood by one of ordinary skill in the art to which the disclosure pertains. Nevertheless, it is expected that during the life of a patent maturing from this application many relevant systems and methods will be developed. Accordingly, the scope of the terms such as computing unit, network, display, memory, server and the like are intended to include all such new technologies a priori.

As used herein the term "about" refers to at least ±10%.

The terms "comprises", "comprising", "includes", "including", "having" and their conjugates mean "including but not limited to" and indicate that the components listed are included, but not generally to the exclusion of other components. Such terms encompass the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" may include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments or to exclude the incorporation of features from other embodiments.

The word "optionally" is used herein to mean "is provided in some embodiments and not provided in other embodiments". Any particular embodiment of the disclosure may include a plurality of "optional" features unless such features conflict.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween. It should be understood, therefore, that the description in range format is merely for convenience and brevity and should not be construed as an inflexible limitation on the scope of the disclosure. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 7 to 4, from 7 to 6, from 3 to 6 etc., as well as individual numbers within that range, for example, 1, 7, 3, 4, 5, and 6 as well as non-integral intermediate values. This applies regardless of the breadth of the range.

It is appreciated that certain features of the disclosure, which are, for clarity, described in the context of separate embodiments, may also be provided in combination in a single embodiment. Conversely, various features of the disclosure, which are, for brevity, described in the context of a single embodiment, may also be provided separately or in any suitable sub-combination or as suitable in any other described embodiment of the disclosure. Certain features described in the context of various embodiments are not to be considered essential features of those embodiments unless the embodiment is inoperative without those elements.

Although the disclosure has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present disclosure. To the extent that section headings are used, they should not be construed as necessarily limiting.

The scope of the disclosed subject matter is defined by the appended claims and includes both combinations and sub combinations of the various features described hereinabove as well as variations and modifications thereof, which would occur to persons skilled in the art upon reading the foregoing description.

What is claimed is:

1. A chip mounted field emitter array comprising an integrated circuit chip and a substrate die, the integrated circuit chip comprising an emitter array chip comprising a chip base layer having a topside and an underside, an array of emission cone electrodes upon the topside of the chip base layer, a gate layer, metallic connecting pads, and a conductive coating on the underside of the chip base layer; and the substrate die comprising an insulating substrate layer having a conductively coated upper surface and at least one feed through electrical connector; and wherein the integrated circuit chip is attached to the substrate die via a sintered powder bonding layer.

2. The chip mounted field emitter array of claim 1 further comprising a chip carrier comprising an insulating base configured to carry the integrated circuit chip, at least one via providing conductive pathways from a conductively coated upper carrier surface and a conductively coated lower carrier surface.

3. The chip mounted field emitter array of claim 1 wherein the chip base layer comprises a silicon layer.

4. The chip mounted field emitter array of claim 1 wherein the gate layer comprises a chromium layer.

5. The chip mounted field emitter array of claim 1 wherein the metallic connecting pads comprise gold electrical connecting pads.

6. The chip mounted field emitter array of claim 1 wherein the conductive coating comprises a gold coating.

7. The chip mounted field emitter array of claim 1 wherein the sintered powder bonding layer comprises a sintered silver powder.

8. The chip mounted field emitter array of claim 2 wherein the chip carrier comprises a Ceramic Leadless Chip Carrier (CLCC).

9. The chip mounted field emitter array of claim 2 wherein bonding pads of the chip carrier are bonded bonding pads of the die via wire bonding.

10. A method for fabricating a field emitter array comprising:
    obtaining an integrated circuit chip having a metal coated base;
    obtaining a chip carrier having a metal coated upper side;
    obtaining a metal powder;
    applying a metal powder to the metal coated upper side of the chip carrier;
    covering the metal powder with the integrated circuit chip;
    compressing the integrated circuit chip and carrier between two heated plates.

11. The method of claim 10 wherein the metal powder comprises particles having a size of 100 nanometers.

12. The method of claim 10 wherein the metal powder comprises particles of silver.

13. The method of claim 10 wherein the heated plates are configured to heat the metal powder to a temperature lower than its melting point.

14. The method of claim 10 wherein the heated plates are configured to heat the metal powder to a temperature above its bonding temperature.

15. The method of claim 10 wherein the step of compressing comprises applying a pressure of 10-8 Torr for 10 minutes.

16. The method of claim 10 wherein further comprising heating the heated plates to a temperature of 830 degrees Celsius.

17. The method of claim 10 further comprising holding the integrated circuit chip and the chip carrier in place throughout.

18. The method of claim 10 wherein the step of applying the metal powder comprises dispensing the metal powder from a syringe at a required thickness.

19. The method of claim 10 wherein the step of applying the metal powder comprises dispensing from a syringe a required volume of the metal powder.

20. The method of claim 10 wherein the step of applying the metal powder comprises dispensing the metal powder from a syringe.

* * * * *